United States Patent [19]
Cantrell

[11] Patent Number: 6,030,461
[45] Date of Patent: Feb. 29, 2000

[54] PORTABLE COOLING SYSTEM FOR USE WITH A SEMICONDUCTOR FABRICATION SYSTEM

[75] Inventor: David Michael Cantrell, Austin, Tex.

[73] Assignee: Advanced Micro Devices, Inc., Sunnyvale, Calif.

[21] Appl. No.: 08/993,809

[22] Filed: Dec. 18, 1997

[51] Int. Cl.[7] .................................................. C23C 16/46
[52] U.S. Cl. .......................... 118/724; 165/68; 165/80.3; 165/87
[58] Field of Search ............................... 118/724; 165/68, 165/80.3, 87

[56] References Cited

U.S. PATENT DOCUMENTS

| | | | |
|---|---|---|---|
| 5,097,890 | 3/1992 | Nakao | 118/724 X |
| 5,636,103 | 6/1997 | Bushner | 165/80.3 X |

Primary Examiner—Leo B. Tentoni

[57] ABSTRACT

A portable cooling system for use with a semiconductor fabrication system having a heating block is provided. A portable cooling system, consistent with one embodiment of the invention, includes a support structure removably mountable on part of the semiconductor fabrication system and near the heating block of the fabrication system. Disposed on the support structure are one or more fans for blowing air over the heating block. In one embodiment, the support structure includes a plate and a plurality of legs which extend down from the plate for mounting on the heating block. In another embodiment, the support structure includes a plate and means for mounting the plate on one or more walls of the semiconductor fabrication system. The portable cooling system facilitates the cooling of the heating block of the fabrication system and can, for example, significantly reduce the time spent cleaning the semiconductor fabrication system as compared to conventional cleaning techniques.

20 Claims, 2 Drawing Sheets

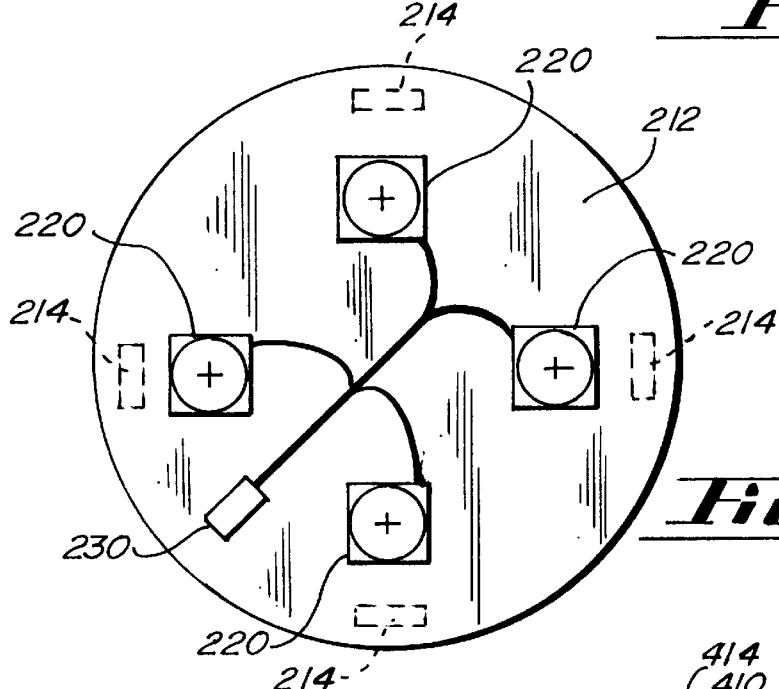
Fig. 2.
Fig. 3.
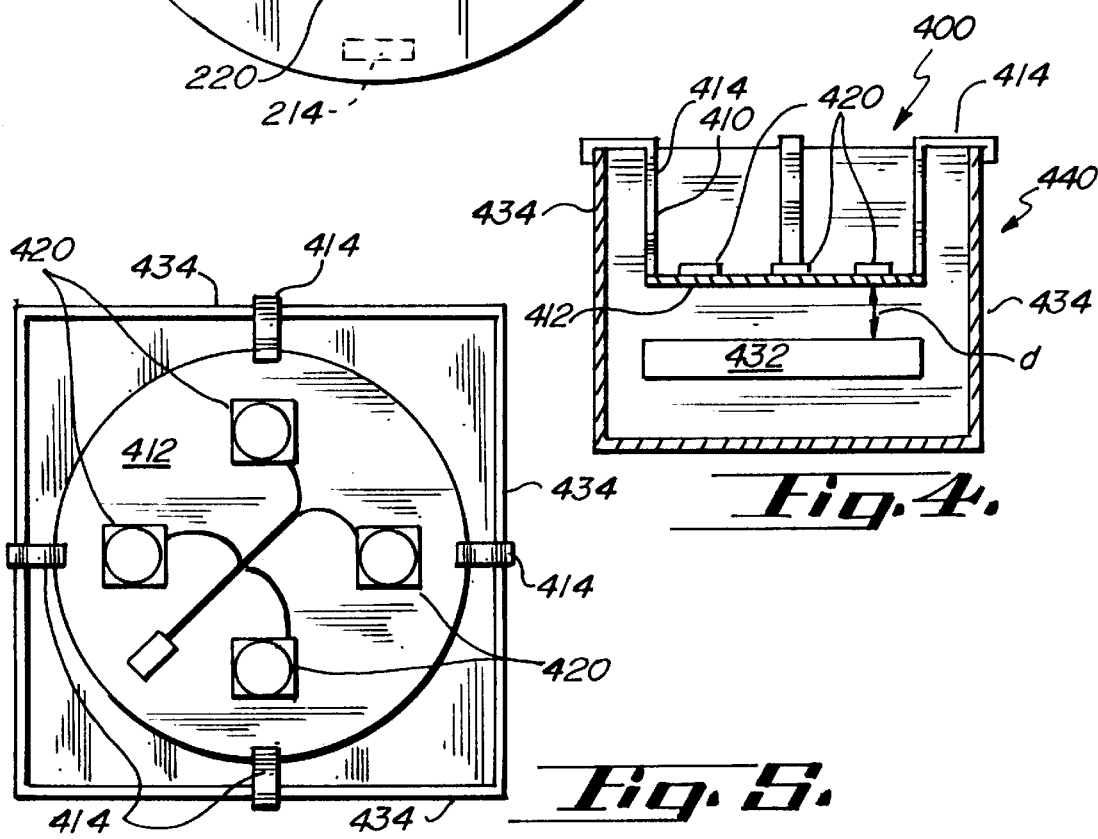
Fig. 4.
Fig. 5.

PORTABLE COOLING SYSTEM FOR USE WITH A SEMICONDUCTOR FABRICATION SYSTEM

FIELD OF THE INVENTION

The present invention relates generally to semiconductor fabrication and, more particularly, to a portable cooling system for use with a semiconductor fabrication system, such as chemical vapor deposition system.

BACKGROUND OF THE INVENTION

Over the last few decades, the electronics industry has undergone a revolution by the use of semiconductor technology to fabricate small, highly integrated electronic devices. In most fabrication lines, chemical vapor deposition (CVD) systems are commonly used to deposit films on semiconductor wafers. A typical CVD system includes: (1) a deposition chamber; (2) gas sources; (3) inlet lines for feeding gas from the gas sources into the deposition chamber; (4) a heating block for heating the wafers on which the film is to be deposited; (5) an outlet line; and (6) a vacuum source for evacuating waste byproducts from the deposition chamber through the outlet line.

During a fabrication run, waste by-product typically accumulates on various components of a CVD system, such as the chamber walls, inlet and outlet lines, and heating block, for example. Excessive accumulation on the CVD heating block in particular can have a deleteriously impact on the fabrication of semiconductor wafers. As a result, the CVD system is periodically shut down and the heating block is cleaned.

Cleaning of the heating block typically involves accessing the heating block, for example, by disassembling the CVD system, and sanding the heating block to remove the accumulated waste byproduct. Prior to sanding the heating block, the block must be allowed to cool to a temperature which is conducive to sanding. In a typical system, the temperature of a heating block may have to fall, for example, from about 500° C. to about 75 to 80° C. prior to sanding. The total time for the cleansing process depends on the severity of the accumulation as well as on the size and temperature of the heating block. Using conventional techniques, a typical cleansing process can often take from 4 to 6 hours or more. The downtime incurred as a result of the cleansing process has a significant impact on production and, accordingly, is desirably minimized.

SUMMARY OF THE INVENTION

The present invention generally relates to a portable cooling system for use with a semiconductor fabrication system having a heating block (e.g., a chemical vapor deposition system). The portable cooling system facilitates the cooling of the heating block of the fabrication system. Use of the heating block can, for example, significantly reduce the time spent cleaning the semiconductor fabrication system as compared to conventional cleaning techniques.

Consistent with one embodiment of the invention, a portable cooling system for use with a semiconductor fabrication system is provided. The portable cooling system includes a support structure removably mountable on part of the semiconductor fabrication system and near the heating block of the fabrication system. Disposed on the support structure are one or more fans for blowing air over the heating block. In one embodiment, the support structure includes a plate and a plurality of legs which extend down from the plate for mounting on the heating block. In another embodiment, the support structure includes a plate and means for mounting the plate on one or more walls of the semiconductor fabrication system.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 2 is a side view of an exemplary cooling system shown in use with the CVD system of FIG. 1 in accordance with an embodiment of the present invention;

FIG. 3 is a top view of the cooling system of FIG. 2;

FIG. 4 is a cross sectional view of an exemplary cooling system shown in use with a semiconductor fabrication system in accordance with another embodiment of the present invention; and FIG. 5 is a top view of the exemplary cooling system of FIG. 4.

Figure 1:
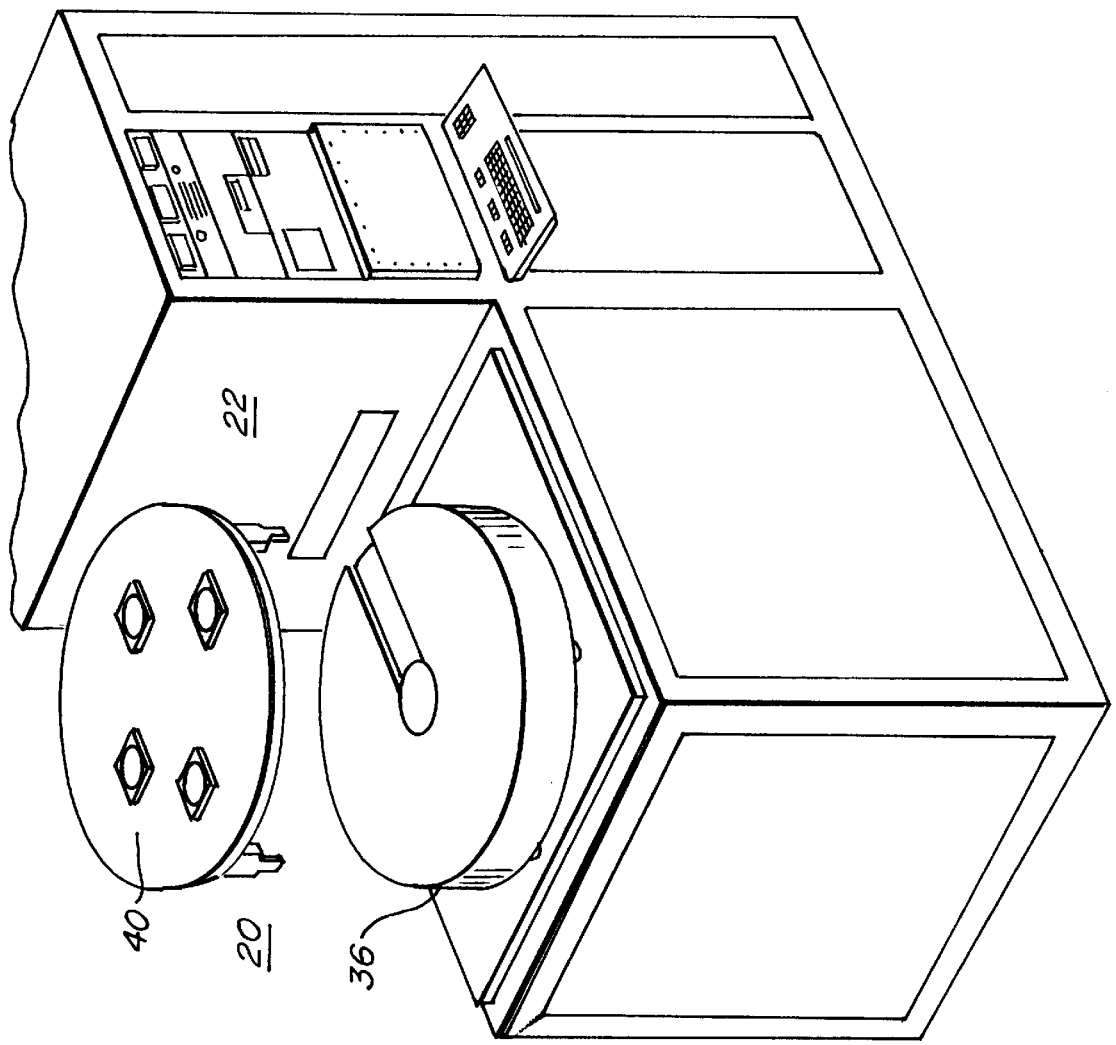
FIG. 1 is an isometric view of an exemplary CVD system which may be used with an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor fabrication systems which employ heating blocks in their operation. The invention is particularly suited to chemical vapor deposition systems, such as plasma-enhanced CVD systems. While the present invention is not so limited, an appreciation of various aspects of the invention will be gained through a discussion of the drawings in connection with the examples provided below.

FIG. 1 illustrates an exemplary chemical vapor deposition system 20, shown with its walls removed, which may be used in an embodiment of the invention. The system 20 typically includes a chemical vapor deposition chamber 22, an inlet conduit or line for directing reactant gases from a gas source into the deposition chamber 22, and an outlet conduit or line for exhausting waste by-product from the deposition chamber 22. The outlet line is typically in fluid communication with a remote vacuum source adapted to provide suction for evacuating waste by-product from the deposition chamber 22.

The chamber 22 further includes a heating block 36 which stores heat and acts as a catalyst for the deposition reaction. Heating blocks in general can come in a number of different shapes and sizes and can be formed of a variety of different materials (though most are typically formed of metal or a metal alloy). The heating block 36 in the illustrated embodiment is a circular block, about 50 inches in diameter and 6 inches thick, formed of aluminum. Typically, the heating block 36 is configured for supporting a semiconductor wafer during the deposition process.

The chemical vapor deposition system 20 of FIG. 1 may, for example be a plasma enhanced chemical vapor deposition (PECVD) system which uses an rf-induced glow discharge generated by an rf generator to transfer energy into the reactant gases provided by the gas source. An exemplary PECVD system is the Novellus Concept One System. While FIG. 1 depicts a CVD system, those skilled in the art will recognize that the present invention can be used with many different types semiconductor fabrication systems which employ heating blocks. Consequently, the CVD system 20 is strictly exemplary and is not intended to be construed as a limitation upon the present invention.

The chemical vapor deposition system 20 can be used to deposit a variety of films on a semiconductor wafer. Exemplary films include TEOS oxide, silicon dioxide and oxynitride, for example. To generate the previously identified films, a variety of reactant and carrier gases can be provided by the gas source. Exemplary gases include oxygen, nitrogen, and silane, for example. During the deposition process, the heating block 36 is typically heated to temperatures of about 400° C. to 500° C. or more in order to facilitate the deposition process. The heating block 36 is typically heated using a heating element as is well-known.

During a fabrication run, waste by-product typically accumulates on various components of the CVD system 20, such as the chamber walls, the inlet and outlet lines, and the heating block 36, for example. Excessive accumulation on the CVD heating block 36 in particular can have deleterious impact on the fabrication of semiconductor wafers. As a result the CVD system 20 is periodically shut down and the heating block 36 is cleaned. The heating block 36 is typically cleaned by exposing the heating block 36 and sanding the accumulated waste by-product from the heating block 36. The heating block 36 is typically exposed by disassembling the CVD system 20 in a well-known manner. Prior to sanding the heating block 36, the heating block is cooled from the reaction temperature (for example, 400 to 500° C.) to a lower temperature suitable for sanding. In accordance with the present invention, a portable cooling system is provided which may be mounted on part of the CVD system 20, near the heating block 36, in order to more quickly cool the heating block 36 to an appropriate sanding temperature. Typically, the cooling system is mounted on the CVD system 20 after the CVD system 20 has been disassembled and the heating block 36 exposed. For purposes of illustration and not of limitation, an exemplary cooling system 40 is shown above heating block 36 in FIG. 1.

An example of a cooling system in accordance with one embodiment of the invention is illustrated in FIGS. 2 and 3. The exemplary cooling system 200 generally includes a support structure 210 which is removably mountable on part of the CVD system 20 and one or more fans 220 disposed on the support structure 210 for blowing air on the heating block 36 when the support structure 210 is supported near the heating block 36. In the illustrated embodiment of FIG. 2, the part of the CVD system 20 on which the support structure 210 is removably mounted is the heating block 36 itself. However, as will be discussed further below, the present invention is not so limited.

The support structure 210 is typically a portable structure which can support the fan(s) 220 near the heating block 36. In the illustrated embodiment of FIGS. 2 and 3, the support structure 210 includes a plate 212 and a plurality of legs 214 extending down from the plate 212 in the direction of the air which blows from the fans 220. The plate 212 may have a shape similar to the shape of the heating block 36, however the invention is not so limited. The thickness of the plate 212 is suitably selected to provide adequate support for the fan(s) 220 disposed on the plate 212. Typical thicknesses range from about ½ to 1 inch.

The legs 214 are typically arranged to support the support structure 210 on the heating block 36 and provide openings 215 between the legs 214 so that air, drawn in by the fans 220, may be flowed over the heating block 36 and out the openings 215. In the exemplary embodiment, four legs 214 are symmetrically distributed about the perimeter of the plate 212 and are of a sufficient length to provide an adequate distance d between the fan(s) 220 and the heating block 36. The legs 214 may be mounted on the plate 212 using a number of suitable methods including, for example, welding or screwing, or the legs 214 may be integrally molded with the plate 212. The openings 215, while illustrated between legs 214, may in alternate embodiments be incorporated within the legs 214 themselves.

The distance d of the fans 220 from the heating block 36 is suitably selected to allow sufficient air flow over the heating block 36 to facilitate cooling of the heating block 36. Distances d ranging from about 2 to 8 inches, and typically between 4–6 inches, are suitable for many applications.

The one or more fans 220 are typically mounted on the plate 212 in order to blow air over the heating block 36. In the exemplary embodiment, four fans 220 are symmetrically mounted on the top surface 216 of the plate 212. Generally, the plate 212 includes one or more apertures each of which is aligned with a respective one of the fans 220 such that air may be pulled from a top side of the plate 212 opposite the heating block 36 to a bottom side of the plate 212 facing the heating block 36. The number of fans and type of fans can vary depending on the application and the environment in which the cooling system 200 is used. In the example embodiment, four 12 volt (v) fans (about 4.75 inches in diameter) are mounted, e.g., screwed to the plate 212. The four fans 220 are typically connected to a switch box 230 used to turn the fans 220 on and off. The switch box 230, in turn, is coupled to an external power source (not shown).

The support structure 210 (e.g., the plate 212 and the legs 214) may be formed of a number of different materials, including in particular a number of different metals or metal alloys. In the example embodiment, a relatively inert material, such as stainless steel, is used to form the support structure 210 including the plate 212 and the legs 214. The use of stainless steel advantageously prevents the support structure 210 from corroding or interacting with the waste by-product from the deposition process.

Use of the above cooling system significantly reduces the amount of time it takes to cool the heating block 36 and reduces the amount of time involved in cleaning the heating block 36 as compared to conventional cleaning techniques. In certain cases, the amount of time needed to cool the heating block 36 can be reduced from about 4 hours to 1 hour and 30 minutes to 1 hour 45 minutes. This can, for example, significantly reduce the down time of the semiconductor fabrication system and increase the production efficiency of a semiconductor fabrication line.

FIGS. 4 and 5 illustrate an exemplary cooling system in accordance with another embodiment of the invention. The cooling system 400 is configured to mount on one or more walls of a semiconductor fabrication system and is particularly useful in conjunction with semiconductor fabrication systems in which access to the heating block is provided by removal of the top of the semiconductor fabrication system.

The cooling system 400 is shown in use with an exemplary semiconductor fabrication system 440 having a heating block 432 which is accessed by removing the top (not shown) of the semiconductor fabrication system 440. While not shown, the semiconductor fabrication system 440 typically includes similar components (e.g., inlet and outlet lines, deposition chamber, etc.) as the CVD system 20 discussed above, with the difference between the two systems being the manner in which the respective heating blocks are exposed. The exemplary semiconductor fabrication system 440 may, for example, be a Genus 8700 Series CVD tool.

The cooling system 400 generally includes a support structure 410 and one or more fans 420 disposed on the support structure 410 for blowing air on the heating block 432 of the semiconductor fabrication system 400. The support structure 410 is typically a portable structure which includes a plate 412 on which the fans 420 are mounted and a means for mounting the support plate 412 on part of the semiconductor fabrication system 440 such that the fans 420 are disposed near the heating block 432 of the semiconductor fabrication system 440. The plate 412 may be similar to the plate 212 discussed above. The fans 420 may, for example, be similar in size, number and arrangement to those used in the cooling system discussed above with respect to FIGS. 2 and 3.

The mounting means typically extends from the plate 412 to mount on part of the semiconductor fabrication system 440. In the example embodiment, the mounting means is arranged to mount on one or more walls 434 of the fabrication system 440 to support the support structure 410 near the heating block 432. The distance d between the support structure 410 (and the fans 420) and the heating block 432 is suitably selected in consideration of the desired airflow over the heating block 432. Distances d ranging from 2 to 8 inches, and typically between 4 and 6 inches, would be suitable for many applications.

The means for mounting the support structure 410 on the wall(s) 434 of the semiconductor fabrication system 440 can be provided by way of a number of different structures. For example, the mounting means may comprise a number of chains which are coupled to the plate 412 and which may be removably coupled to the wall(s) 434 of the semiconductor fabrication system 440. In the example embodiment, the mounting means includes one or more flanges 414 which are configured to latch onto one or more walls 434 of the semiconductor fabrication system 400. The flanges 414 may be mounted on the plate 412 (e.g., by welding or screwing) or may be integrally formed with the plate 412.

The above embodiments illustrate a number of different mounting structures (e.g., legs, flanges, chains, etc.) for mounting a cooling system to semiconductor fabrication systems and a number of different parts (e.g., heating block, walls) of a semiconductor fabrication system on which a cooling system may be mounted. The intent however is not to limit the invention to the illustrated embodiments. Different mounting structures and different mounting platforms may be employed and are intended to be covered by the present invention. For example, components of a semiconductor fabrication system other than its walls or its heating block may the parts on which a cooling system is mounted.

As noted above, the present invention is applicable to a number of fabrication systems which employ heating blocks in their operation. Accordingly, the present invention should not be considered limited to the particular examples described above, but rather should be understood to cover all aspects of the invention as fairly set out in the attached claims. Various modifications in, for example, materials, sizes, shapes, and arrangement, and numerous structures will be readily apparent to those of skill in the art to which the present invention is directed upon review of the present specification. The claims are intended to cover such modifications and structures.

What is claimed is:

1. A portable cooling system for use with a semiconductor fabrication system having a heating block, comprising:
    a semiconductor fabrication component forming part of the semiconductor fabrication system;
    a support structure removably mountable on the component of the semiconductor fabrication system; and
    one or more fans disposed on the support structure for blowing air on the heating block when the support structure is supported and heated by the heating block.

2. The cooling system of claim 1, wherein the support structure is mounted such that the one or more fans are disposed about 2 to 8 inches from the heating block.

3. The cooling system of claim 1, wherein the component of the semiconductor system includes the heating block.

4. The cooling system of claim 3, wherein the support structure includes a plate and mounting means for mounting the plate on the heating block.

5. The cooling system of claim 4, wherein the mounting means includes a plurality of legs extending down from the plate in the direction of the blowing air, the legs being mountable on the heating block.

6. The cooling system of claim 5, wherein the plurality of legs includes four legs.

7. The cooling system of claim 1, wherein the component of the semiconductor system includes one or more walls of the semiconductor system.

8. The cooling system of claim 1, wherein the semiconductor fabrication component includes a vertical member and the support structure includes support means for supporting the support structure along the vertical member of the support structure.

9. The cooling system of claim 1, wherein the support structure includes one or more holes, each of the one or more fans being aligned with a respective one of the one or more holes for pulling air from a side of the support structure opposite the heating block to a side of the support structure facing the heating block.

10. The cooling system of claim 1, wherein the one or more fans includes four fans.

11. The cooling system of claim 1, wherein the support structure is formed from stainless steel.

12. The cooling system of claim 1, wherein the semiconductor fabrication system is a chemical vapor deposition system.

13. A portable cooling system for use with a semiconductor fabrication system having a heating block, comprising:
    a semiconductor fabrication component forming part of the semiconductor fabrication system;
    blowing means for blowing air; and
    support means, removably mountable on the component of the semiconductor fabrication system, for supporting the blowing means such that the blowing means blows air on the heating block.

14. The cooling system of claim 13, wherein the support means is mounted such that the blowing means is disposed about 2 to 8 inches from the heating block.

15. The cooling system of claim 13, wherein the component of the semiconductor fabrication system includes the heating block.

16. The cooling system of claim 15, wherein the support means includes a plate and mounting means for mounting the plate on the heating block.

17. The cooling system of claim 16, wherein the mounting means includes a plurality of legs extending down from the plate in the direction of the blowing air, the legs being mountable on the heating block.

18. The cooling system of claim 13, wherein the component of the semiconductor fabrication system includes one or more walls of the semiconductor fabrication system.

19. The cooling system of claim 18, wherein the support means includes a plate and mounting means for mounting the plate on the vertical member of the support structure.

20. The cooling system of claim 19, wherein the semiconductor fabrication component includes a vertical member and the mounting means includes one or more flanges for mounting the support means on the vertical member of the support structure.

* * * * *

UNITED STATES PATENT AND TRADEMARK OFFICE
CERTIFICATE OF CORRECTION

PATENT NO. : 6,030,461
DATED : February 29, 2000
INVENTOR(S) : CANTRELL

It is certified that error appears in the above-indentified patent and that said Letters Patent is hereby corrected as shown below:

Col. 5, line 61: after "block may" insert --be--.

Signed and Sealed this

Third Day of April, 2001

Attest:

NICHOLAS P. GODICI

*Attesting Officer*  *Acting Director of the United States Patent and Trademark Office*